(12) United States Patent
Ohmuro et al.

(10) Patent No.: US 8,241,515 B2
(45) Date of Patent: Aug. 14, 2012

(54) METHOD OF MANUFACTURING SEMICONDUCTOR DEVICE AND SEMICONDUCTOR MANUFACTURING APPARATUS

(75) Inventors: Kazuhiko Ohmuro, Saitama (JP); Takayuki Izumi, Tokyo (JP); Ryoji Shigemasa, Tokyo (JP); Tomoyuki Ohshima, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 881 days.

(21) Appl. No.: 12/073,983

(22) Filed: Mar. 12, 2008

(65) Prior Publication Data

US 2008/0242103 A1 Oct. 2, 2008

(30) Foreign Application Priority Data

Mar. 30, 2007 (JP) ................................. 2007-094714

(51) Int. Cl.
*B44C 1/22* (2006.01)
*C03C 15/00* (2006.01)
*C03C 25/68* (2006.01)
*C23F 1/00* (2006.01)

(52) U.S. Cl. ......................................... 216/83; 438/745
(58) Field of Classification Search .................. 438/745; 216/83
See application file for complete search history.

(56) References Cited

U.S. PATENT DOCUMENTS

2004/0222191 A1* 11/2004 Kim et al. ....................... 216/83

FOREIGN PATENT DOCUMENTS

JP 2002-208578 A 7/2002

* cited by examiner

*Primary Examiner* — Roberts Culbert
(74) *Attorney, Agent, or Firm* — Rabin & Berdo, P.C.

(57) ABSTRACT

A method of manufacturing a semiconductor device having a process for cleaning a semiconductor substrate after the semiconductor substrate is etched for patterning includes a first process of preparing the semiconductor substrate having a first temperature, a second process of setting the semiconductor substrate at a second temperature, a third process of etching the semiconductor substrate having the second temperature by etching liquid having a third temperature, a fourth process of cleaning the semiconductor substrate to which the etching liquid is adhered, by ultrapure water having a fourth temperature, wherein the second temperature is set at the range between the first and the third temperatures.

8 Claims, 5 Drawing Sheets

METHOD OF MANUFACTURING SEMICONDUCTOR DEVICE AND SEMICONDUCTOR MANUFACTURING APPARATUS

CROSS-REFERENCE TO RELATED APPLICATION

This application claims the priority benefit of Japanese Patent Application No. 2007-094714, filed Mar. 30, 2007, the entire disclosure of which is incorporated herein by reference.

BACKGROUND OF THE INVENTION

1. Field of the Invention

The invention relates to a method of manufacturing a semiconductor device and a semiconductor manufacturing apparatus, specifically related to a method of manufacturing a semiconductor device having a process for etching a substrate used for a semiconductor device and an etching apparatus.

2. Description of the Related Art

Generally, during a semiconductor device manufacturing process, when a wet-etching process is performed to a substrate or a semiconductor layer epitaxially grown on the substrate, the following steps are performed in that order; an etching step, a cleaning step using ultrapure water and a drying step. There are two main kinds in the wet-etching process, these are, a low-temperature wet-etching, and a high-temperature wet-etching. It is preferable to perform the low-temperature wet-etching in order to control the etching process with a high degree of accuracy.

After performing the etching process, it is necessary to remove waste material adherent to wiring patterns by a liquid remover. According to Japanese laid-open patent publication JP 2002-208578A, it is disclosed that the substrate is set up in temperature same as temperature of the liquid remover.

However, in the case that a patterning process was performed for instance by a low-temperature wet etching in the range between 0° C. and 20° C., even if the substrate, which is in the room temperature, is soaked in the etching liquid, which is cooled in the range between 0° C. and 20° C., the temperature of the etching liquid contacting the surface of the substrate is raised because of the temperature of the surface of the substrate, which is higher than that of the etching liquid. As a result, the etching, which is not the low-temperature wet etching as planned, is performed to a substrate or the semiconductor layer epitaxially grown on the substrate, instantaneously. Moreover, after performing the low-temperature wet etching in the range between 0° C. and 20° C., when the substrate to which the etching liquid cooled in the range between 0° C. and 20° C. is adhered is cleaned with the ultrapure water of the room temperature, the temperature of the etching liquid being adhered to the surface of the substrate is raised before the cleaning process is completed. As a result, the etching, which is not the low-temperature wet etching as planned, is performed to a substrate or the semiconductor layer epitaxially grown on the substrate, instantaneously.

SUMMARY OF THE INVENTION

An objective of the invention is to solve the above-described problem and to provide a method of manufacturing a semiconductor device, which can control a temperature of a wet etching processing to a substrate or semiconductor layer with a high degree of accuracy The objective is achieved by a method of manufacturing a semiconductor device having a process for cleaning a semiconductor substrate after the semiconductor substrate is etched for patterning, which includes a first process of preparing the semiconductor substrate having a first temperature, a second process of setting the semiconductor substrate at a second temperature, a third process of etching the semiconductor substrate having the second temperature by etching liquid having a third temperature, a fourth process of cleaning the semiconductor substrate to which the etching liquid is adhered, by ultrapure water having a fourth temperature, wherein the second temperature is set at the range between the first and the third temperatures.

BRIEF DESCRIPTION OF THE DRAWINGS

The invention will be more particularly described with reference to the accompanying drawings, in which.

DETAILED DESCRIPTION OF THE PREFERRED EMBODIMENTS

The first through third embodiments of the invention as to a method of manufacturing a semiconductor device are explained together with drawings as follows. The first through third embodiments of the invention as to a semiconductor manufacturing apparatus are also explained together with drawings as follows. In each drawing (FIGS. 1A~1D, FIG. 2, FIG. 3, FIG. 4 and FIG. 5), the same reference numbers designate the same or similar components through all embodiments.

The First Method Embodiment

FIGS. 1A~1D is sequential conceptual views for showing an etching process performed to a semiconductor device, according to a first embodiment. A method of manufacturing a semiconductor device includes a wet etching process, which includes mainly four processes. The first process is to prepare a semiconductor substrate to be etched or a substrate on which a semiconductor layer epitaxially grown to be etched (hereinafter it is called a semiconductor substrate), which is set at a first temperature. The second process is to set the semiconductor substrate at a second temperature. The third process is to etch the semiconductor substrate, which is set at the second temperature, with etching liquid, which is set at a third temperature. The fourth process is to remove the etching liquid set at the third temperature being adhered to the semiconductor substrate with ultrapure water, which is set at a fourth temperature. Here, the second temperature is set in the range between the first and the third temperatures. The detail explanation of each process is described as follows.

[First Process]

Figure 1A:
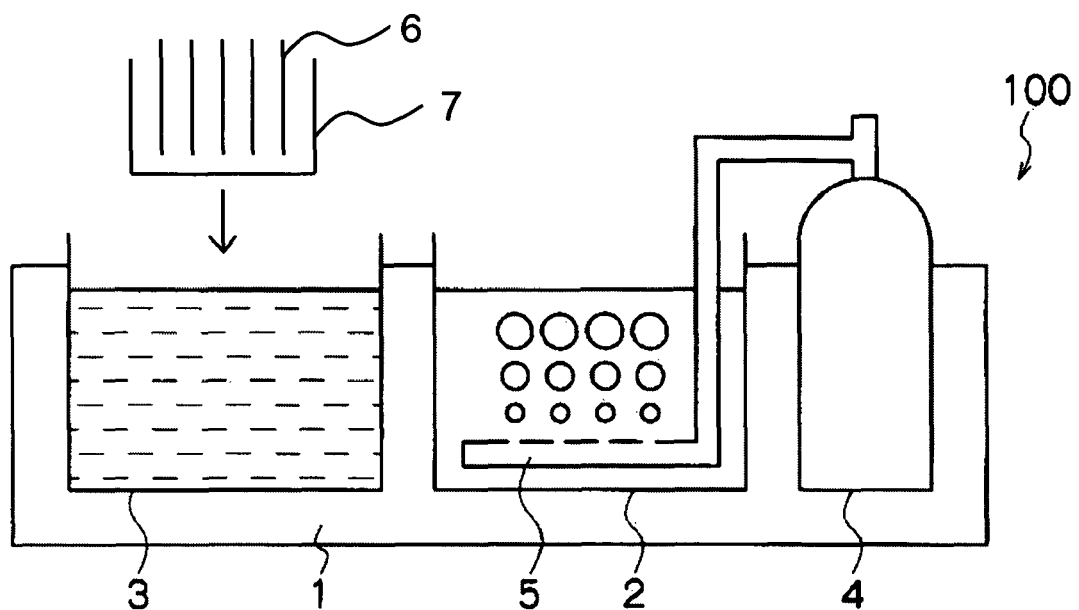
FIGS. 1A~1D is sequential conceptual views for showing an etching process performed to a semiconductor device, according to a first embodiment.

As shown in FIG. 1A, a semiconductor substrate 6 used for a semiconductor device is prepared. Here, the semiconductor substrate 6 includes a substrate on which a semiconductor layer is epitaxially grown. The semiconductor substrate 6 suitable for the first method embodiment is formed of GaAs, InP, Si, SiC, GaN or Sapphire, specifically GaAs, InP.

The temperature of the semiconductor substrate 6 stacked in a case 7 is set at the room temperature, which is defined as the first temperature. Thus, the semiconductor substrate 6 having the first temperature is prepared in the first process. The first temperature is set in the range between 20° C. and 25° C. Generally, since the semiconductor device is manufactured under the well-controlled room temperature, which is the first temperature, the temperature of the semiconductor substrate 6 is normally set at the first temperature. Thus, it is not necessary to do some processes to the semiconductor substrate 6 in order to set the semiconductor substrate 6 at the first temperature if the semiconductor substrate 6 is placed in the room.

[Second Process]

The second process includes that the semiconductor substrate 6 having the first temperature is set at the second temperature.

The second temperature is not the same temperature as the first temperature. The second temperature, which depends on the third temperature described in the third process later, may be higher or lower than the first temperature. The second temperature is set at a temperature that etching characteristics to the semiconductor substrate 6 performed in the third process is not influenced even momentarily. To satisfy this requirement, the second temperature is set in the range between the first and the third temperatures in order to control the temperature at the surface of the semiconductor substrate 6. It is preferable to set the second temperature at a temperature close to the third temperature. In the case that the third process includes the low-temperature wet etching, the second temperature is preferably set in the range between 0° C. and 20° C., specifically, between 5° C. and 15° C., which is considered as almost 10° C. difference from the temperature that the low-temperature wet etching is performed, and which is in the range between the first and the third temperatures, in order to obtain the controllable etching characteristics. In the case that the third process includes the high-temperature wet etching, the second temperature is preferably set at or over 25° C., specifically, at or over 35° C., which is considered as almost 10° C. difference from the temperature that the high-temperature wet etching is performed, and which is in the range between the first and the third temperatures, in order to obtain the controllable etching characteristics.

Figure 1B:
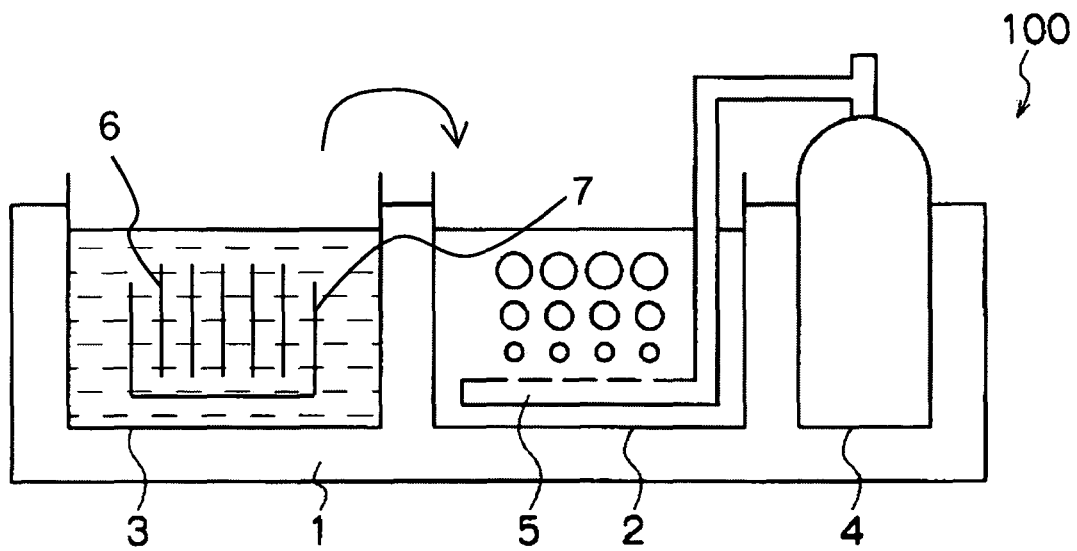

As shown in FIG. 1B, the semiconductor substrate 6 is set at the second temperature by soaking it with the case 7 in the first ultrapure water whose temperature is set at the second temperature stored in a container 3. Although the soaking period to set the semiconductor substrate 6 at the second temperature depends on the characteristics of the thermal conductivity of the case 7, of the martial of the semiconductor substrate 6 and of the capacity of the container 3 in which the first ultrapure water is stored, it is preferably completed in a short period as possible in view of the productivity. A plurality of the semiconductor substrates 6 can be set in the case 7. Although the number of the semiconductor substrates 6 depends on the above-described characteristics and the productivity, it is necessary to set all of the semiconductor substrates 6 at the second temperature.

Since the third process is performed while the semiconductor substrates 6 holds its second temperature after the semiconductor substrates 6 is set at the second temperature, the container 3 of the first ultrapure water in which the semiconductor substrate 6 is soaked is preferably disposed within the sequential system where a container 2 in which the etching liquid is stored is located. In other words, the container 3 is disposed right next to the container 2. The first ultrapure water stored in the container 3 is preferably cooled or hearted together with the etching liquid stored in the container 2.

Here, the first ultrapure water is defined as water that the impurities are further removed from the pure water, and its resistivity is around 1.8MΩ·cm. A period from the time that the second process is completed to the time that the third process is started is preferably within few second in view of holding the second temperature of the semiconductor substrate 6.

Although the semiconductor substrate 6 is set at the second temperature by the first ultrapure water in the first embodiment, it is possible to set the semiconductor substrates 6 at the second temperature by air. That is, the semiconductor substrate 6 is exposed to air, which is cooled or heated at the second temperture.

[Third Process]

The third process includes that the semiconductor substrate 6 having the second temperature is etched with the etching liquid, which is set at the third temperature.

Figure 1C:
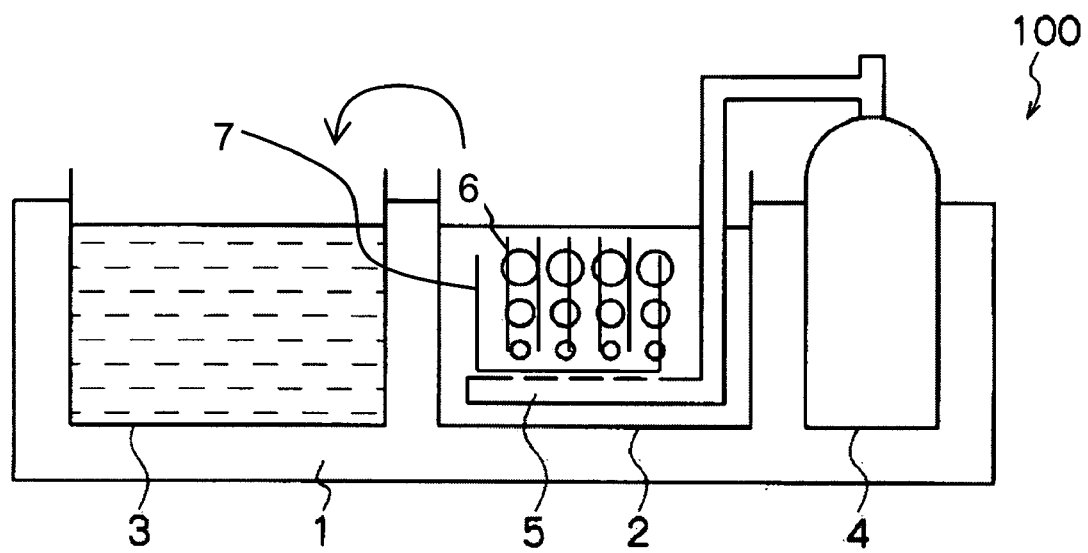

As shown in FIG. 1C, the semiconductor substrate 6 having the second temperature, which is close to the temperature of the etching liquid, is etched by soaking it with the case 7 in the etching liquid, which is set at the third temperture and is stored in the container 2. According to the third process, since the semiconductor substrate 6 is pre-cooled or pre-heated in the second process to the temperature of the etching liquid just before the third process is performed, the temperature of the semiconductor substrate 6 at the onset of the etching process is held similar to the predetermined wet etching temperature. Even if there is a temperature gap between the semiconductor substrate 6 and the etching liquid, although the temperature of the etching liquid, which surrounds the semiconductor substrate 6, is increased or decreased instantaneously, such a temperature gap is too small to affect the etching process.

In the third process, the well known acid etchant or alkaline etchant is used as the etching liquid in the low-temperature etching process, preferably, the acid etchant. Aqueous solution is for example used for a solvent for the etching liquid. In the high-temperature etching process, organic alkaline etchant is used as the etching liquid.

A combination of the etching liquid and the solvent may depend on material of the substrate 6 to be etched or of the epitaxial layer to be etched. When GaAs is used for the substrate 6 or the epitaxial layer, mixed aqueous solution including phosphoric acid and hydrogen peroxide or including organic acid and hydrogen peroxide is used as the etching liquid. When Si is used for the substrate 6 or the epitaxial layer, aqueous solution including potassium iodide solution or hydrofluoric acid is used as the etching liquid.

As described above, a period from the time that the second process is completed to the time that the third process is started is preferably within few second in view of holding the second temperature of the semiconductor substrate 6.

The etching liquid is formed by adding acid into the first ultrapure water stored in a glass beaker, and then it is agitated with a stirrer.

The temperature of the etching liquid, which is set at the third temperature, is determined by the condition that the semiconductor substrate 6 is etched to have a designed shape in order to have designed characteristics. Further, as described above, a temperature of the first ultrapure water used in the second process, which sets the semiconductor substrate at the second temperature, is set at a temperature that an amount of the etching at the etching rate of the etching liquid at the second temperature has no influence to the characteristics as designed. Preferably, the temperature of the first ultrapure water used in the second process is set at the same temperature of the etching liquid. Ultrapure water will also be used in the cleaning process as defined as the fourth process. Although the temperature of the ultrapure water used in the fourth process is set at the fourth temperature, it is preferably set at the same temperature of the etching liquid because of the same reason for the first ultrapure water used in the second process as described above. The detail for the fourth process will be described below.

In order to perform the uniform etching, it is possible to agitate the etching liquid with bobbles of inert gas, such as $N_2$ or Ar. As shown in FIG. 1C, the bobbles of the inert gas are supplied from a nozzle 5 located at the bottom of the container 2, which is connected to an inert gas canister 4. The inert gas is preferably set at the third temperature.

A period from the time that the third process is completed to the time that the fourth process is started is preferably within few seconds, preferably within one second, in view of controlling t the etching depth with high degree of accuracy.

[Fourth Process]

The fourth process includes that the etching liquid of the second temperature adhering to the semiconductor substrate 6 is cleaned by ultrapure water, which is set at the fourth temperature.

Figure 1D:
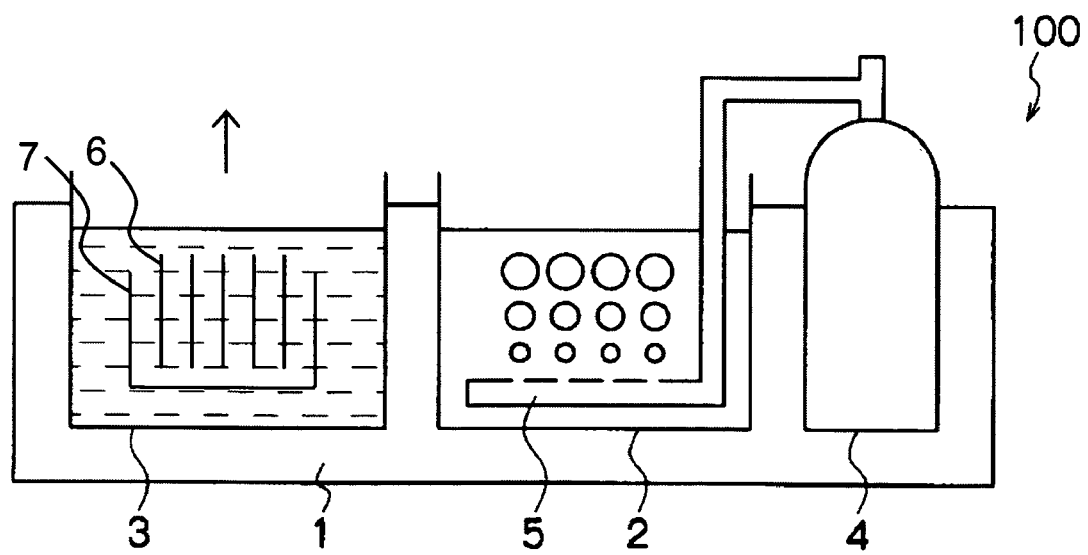

The semiconductor substrate 6 may be cleaned either by the first ultrapure water used in the second process as shown in FIG. 1D or by a newly supplied ultrapure water called as the second ultrapure water. If the semiconductor substrate 6 is cleaned by the first ultrapure water used in the second process, the fourth temperature is exactly same as the second temperature. If the semiconductor substrate 6 is cleaned by the second ultrapure water, the second ultrapure water is set at the fourth temperature. The fourth temperature is set at temperature, which is similar to the third temperature or is within 10° C. lower than the third temperature in the case that the high-temperature wet etching is performed in the third process, or within 10° C. higher than the third temperature in the case that the low-temperature wet etching is performed in the third process. The most important is that the fourth temperature is set in the range between the third and the first temperature. The following description is the case that the semiconductor substrate 6 is cleaned by the first ultrapure water used in the second process.

The cleaning process is performed by swinging the semiconductor substrate 6 with the first ultrapure water or by spinning the semiconductor substrate 6 in the first ultrapure water. When the semiconductor substrate 6 is swung in the first ultrapure water, the period for swinging the semiconductor substrate 6 is not limited to the specific time if the etching liquid is removed from the semiconductor substrate 6. However, it is preferably completed in a short period as possible in view of the productivity. When the semiconductor substrate 6 is spun in the first ultrapure water, the spinning speed I preferably set in the range between 10 rpm and 5000 rpm.

Since the etching liquid adhering to the semiconductor substrate 6 is interfused into the first ultrapure water in the container 3, it is preferred to change the first ultrapure water in the container 3, periodically. Specifically, if the etching of the semiconductor substrate 6 in the container 3 is measured, the first ultrapure water in the container 3 should be changed.

In the first method embodiment, although the semiconductor substrate 6 is soaked in the containers 3 and 5 during the second through the fourth process, ultrapure water and etching liquid can be sprayed to the semiconductor substrate 6. In this case, since the fresh ultrapure water is used al the time, it is necessary to worry about the interfusion of the etching water into the ultrapure water.

The first method embodiment can be applied for either the low-temperature wet-etching or the high-temperature wet-etching. In the high-temperature wet-etching, when the second trough the fourth temperatures are set as substantially the same, it is possible to avoid attaching the solid product on the surface of the semiconductor substrate 6, which is coagulated by cooling at the surface of the semiconductor substrate 6 wherein the etching liquid for the high-temperature wet-etching has a concentration, which become oversaturation at room temperature.

The Second Method Embodiment

The third temperature is preferably lower than the first temperature, according to the second method embodiment. In other words, the second method embodiment is specifically designed to the low-temperature wet-etching. The low-temperature wet-etching is preferred in order to control the etching process with high degree of accuracy. Specifically, for the miniaturization of the semiconductor device, a fine process is required. Since the etching rate of the low-temperature wet-etching is small, the fine process can be expected by it.

The difference between the first and the third temperatures is described above.

The Third Method Embodiment

Figure 2:
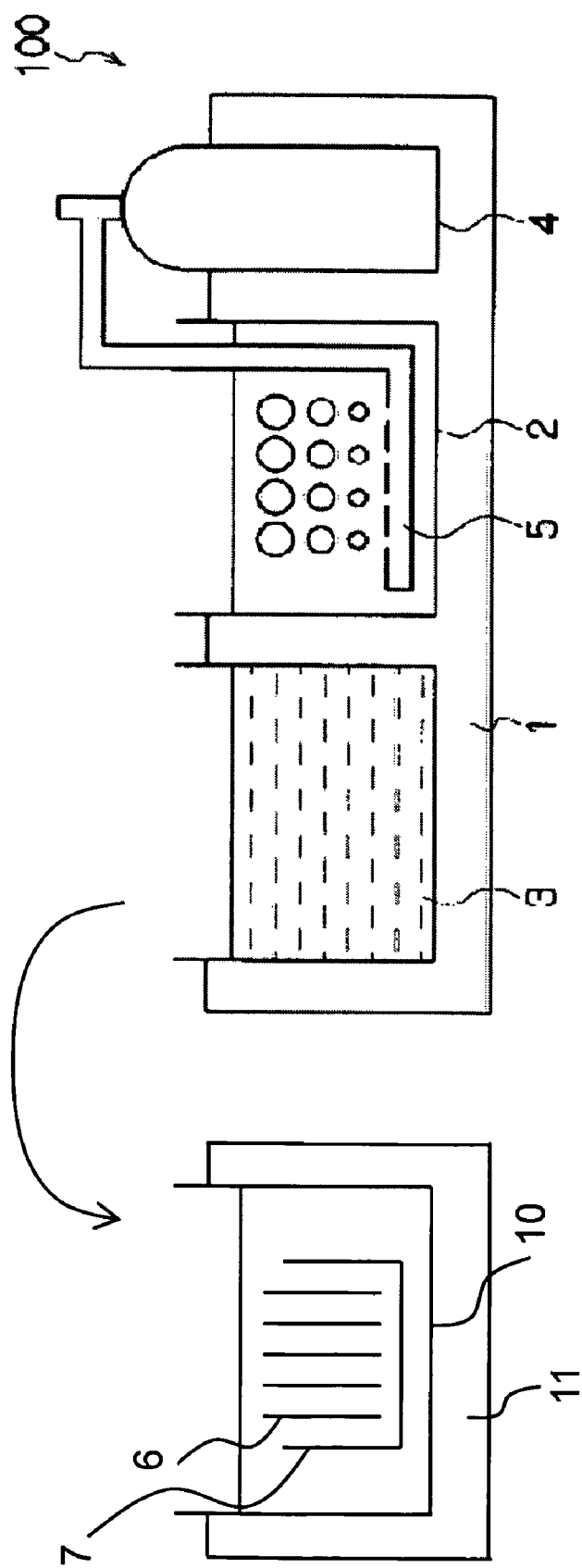
FIG. 2 is a conceptual view for showing an etching process performed to a semiconductor device, according to a third embodiment.

FIG. 2 is a conceptual view for showing an etching process performed to a semiconductor device, according to a third embodiment. As shown in the FIG. 2, another container 10 in which the third ultrapure water having a fifth temperature, which is different from the fourth temperature, is placed in the additional system 11 which is disposed next to the first cooling system 1. According to the third embodiment, the fifth process is performed. In the fifth process, the first ultrapure water adhered to the semiconductor substrate 6 is cleaned with the third ultrapure water having the fifth temperature in the container 10. The fifth temperature is set at a temperature, which is the same to or closed to the room temperature. This is the reason why the addition system 11 having another container 10 should be separated from the first cooling system 1. That is, that the fifth temperature should be set as the same or to close at the room temperature.

As well as the second method embodiment, the third method embodiment is also specifically designed to the low-temperature wet-etching. When the semiconductor substrate 6 is exposed to the air having the room temperature after the semiconductor substrate 6 is cleaned by the first ultrapure water having the fourth temperature, condensation is formed at the surface of the semiconductor substrate 6 because of the amount of the saturated water vapor. By cleaning the semiconductor substrate 6 with the third ultrapure water having the fifth temperature, it is possible to prevent the condensation being formed at the surface of the semiconductor substrate 6. Further, it is possible to clean the semiconductor substrate 6 to which the first ultrapure water, which the etching liquid is mixed, is adhered, with the third ultrapure water completely.

According to the method of manufacturing the semiconductor device described in the first through the third embodiments, the etching process can be performed to the semiconductor substrate at the designed temperature so that the desired etching shape can be obtained with high degree of accuracy.

The First Apparatus Embodiment

Figure 3:
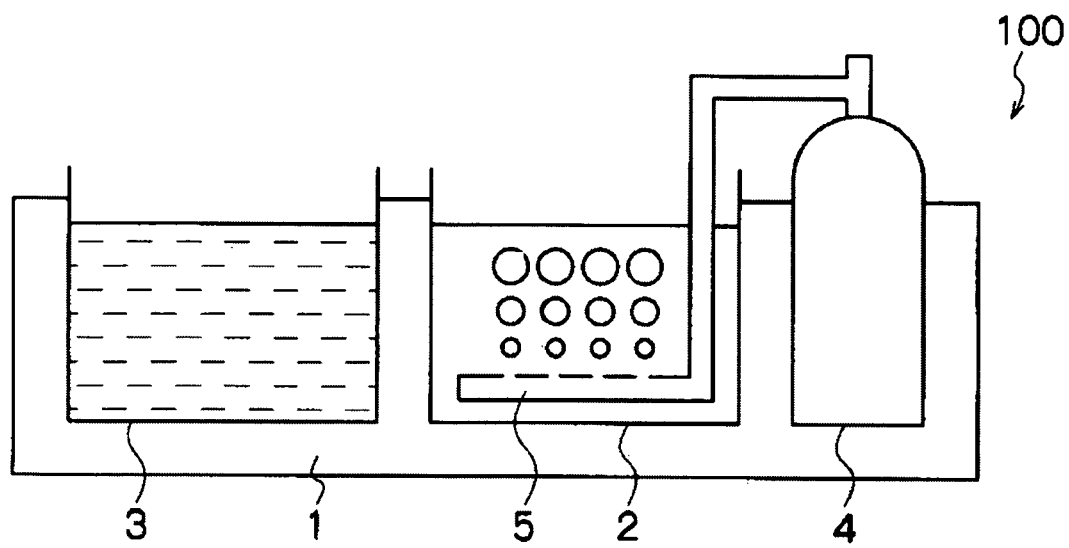
FIG. 3 is a conceptual view of a semiconductor manufacturing apparatus, according to a first embodiment.

FIG. 3 is a conceptual view of a semiconductor manufacturing apparatus, according to a first apparatus embodiment.

As shown in FIG. 3, the semiconductor manufacturing apparatus 100 includes a first cooling system 1, a container 2 in which etching liquid having a third temperature is stored for etching a semiconductor substrate, a container 3 in which ultrapure water having the second temperature is stored for pre-cooling the semiconductor substrate or for cleaning the etching liquid adhered to the semiconductor substrate and an inert gas canister 4 in which inert gas for agitating the etching liquid is stored. The inert gas canister 4 includes a nozzle 5 having openings, which is located at the bottom of the container 2, so that bobbles of inert gas are supplied from the opening of the nozzle 5. The container 3, the container 2 and the inert gas canister 4 are covered by the first cooling system at their bottoms and sides. The etching process can be performed in low temperature by the cooling system 1.

The first cooling system includes container for storing liquid such as water or antifreeze liquid, and the liquid is cooled by a chiller. As shown in FIG. 2, in order to perform the third method embodiment, another container 10 in which the third ultrapure water is stored having the fifth temperature can be disposed next to the container 3 in the first cooling system 1.

The Second Apparatus Embodiment

Figure 4:
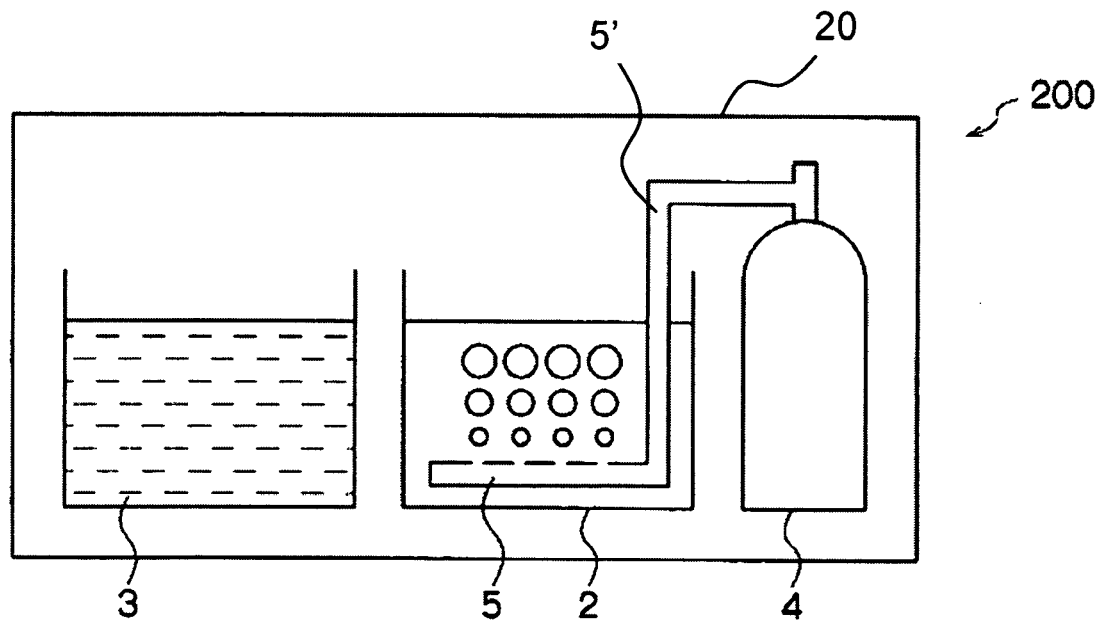
FIG. 4 is a conceptual view of a semiconductor manufacturing apparatus, according to a second embodiment.

FIG. 4 is a conceptual view of a semiconductor manufacturing apparatus, according to a second embodiment. The semiconductor manufacturing apparatus 200 includes a second cooling system 20 instead of the first cooling system 1. Other components used in the first and the second apparatus are the same.

The second cooling system 20 includes a container covering up the containers 2 and 3 and the inert gas canister 4. The container is filled with gas having the third temperature for cooling the semiconductor manufacturing apparatus 200.

According to the second apparatus embodiment, since the container 2 and 3 and the inert gas canister 4 are covered up, the semiconductor substrate 6 can be maintained at its third temperature between the pre-cooling process and the etching process or the etching process and cleaning process. Since a tube 5' between the inert gas canister 4 and its nozzle 5 are also maintained at the third temperature, the semiconductor substrate 6 can be maintained at its third temperature all the time from the moment starting the etching process to the moment completing the cleaning process. When the second cooling system 20 is well sealed, the cooling system can be used as a cooling room for the semiconductor substrate 6 so that the semiconductor substrate 6 is cooled to the third temperature by placing it therein. Further, when the second cooling system 20 is filled with the inert gas, such as $N_2$ or Ar, it is possible to prevent the oxygen being dissolved into the etching liquid to the ulterpure water. If the dissolved oxygen in the etching liquid or the ulterpure water is pre-removed, and then, the etching liquid or the ulterpure water are placed in the cooing system, it is possible to prevent the semiconductor substrate 6 being etched abnormally by the dissolved oxygen. As alternative, it is possible to cover up the containers 2 and 3 and the inert gas canister 4, separately with individual cooling systems. As well as the first apparatus embodiment, in order to perform the third method embodiment with the second apparatus embodiment, the addition container 11 shown in FIG. 2 in which the third ultrapure water is stored having the fifth temperature can be disposed next to the container 3 in the second cooling system 20, but should be separated from the second cooling system 20.

The Third Apparatus Embodiment

Figure 5:
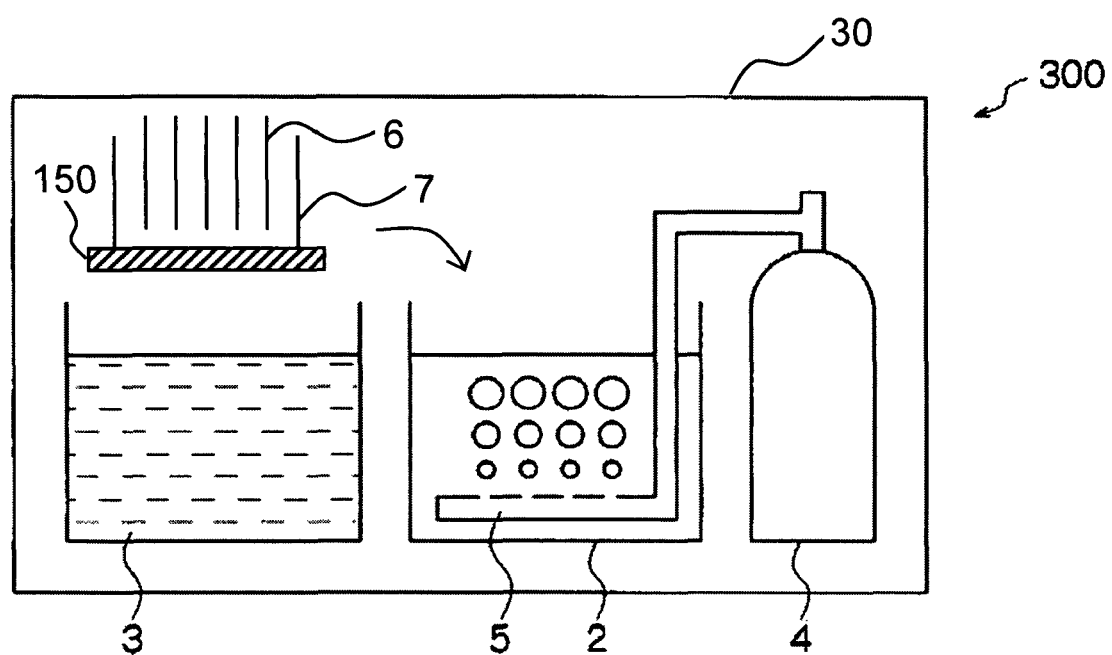
FIG. 5 is a conceptual view of a semiconductor manufacturing apparatus, according to a third embodiment.

FIG. 5 is a conceptual view of a semiconductor manufacturing apparatus, according to a third embodiment. The semiconductor manufacturing apparatus 300 further includes a holder 150 for holding a case 7 in a third cooling system 30, compared with the second cooling system 20 used in the semiconductor manufacturing apparatus 200 of the second embodiment. Other components used in the first and the second apparatus are the same.

Therefore, the third cooling system 30 includes a container covering up the containers 2 and 3, the inert gas canister 4 and the holder 150. As well as the second cooling system 20 shown in FIG. 4 the container is also filled with gas having the third temperature for cooling or heating the semiconductor substrate. The holder 150 is disposed in the third cooling system 30 for holding the case 7 and a semiconductor substrate 6 therein. Therefore, the semiconductor substrate 6 and its case 7 are pre-heated or pre-cooled to the third temperature when they are held by the holder 150 for a certain period.

According to the third apparatus embodiment, the semiconductor substrate 6 and the case 7, which are held by the holder 150, can be pre-cooled or pre-heated to the third temperature by just exposing them to the atmosphere within the concealed third cooling system 30 filled with the inert gas. As a result of the pre-heating or the pre-cooling process, it is possible to skip the second process, which pre-heats or pre-cools the semiconductor substrate 6 to the second temperature. Therefore, it is possible to save the time if the semiconductor substrate 6 and the case 7 are pre-heated or pre-cooled by placing them on the holder 150 during the other semiconductor substrate 6 and the case 7 are in process.

As described above, the other conditions, such as a kind of inert gas, can be the same as these used in the second cooling system 20 shown in FIG. 4. In addition, as well as the second cooling system 20 shown in FIG. 4, in order to perform the third method embodiment with the third apparatus embodiment, the additional container 11 shown in FIG. 2 in which the third ultrapure water is stored having the fifth temperature can be disposed next to the container 3 in the second cooling system 30, but should be separated from the second cooling system 20.

Actual Experiment

With reference to the FIGS. 1A-1D, one of the actual experiments for manufacturing the semiconductor device using the first method embodiment is explained as follows.

First, as the first process, ten (10) semiconductor substrates 6 stored in the case 7 made of fluoroethylene resin is prepared. All semiconductor substrates 6 are set its temperature at 23° C., which is a room temperature, as the first temperature.

Next, as the second process, the container 3 whose capacity is six (6) litters, which is filled with five (5) litters of the ultrapure water, the container 2 whose capacity is six (6) litters, which is filled with five (5) litters of the etching liquid including citric acid and hydrogen peroxide solution, and the N2 canister 4 are cooled at 5° C. by the cooling system 1. The semiconductor substrates 6 in the case 7 are soaked into the ultrapure water in the container 3 for one (1) minute. As a result, the semiconductor substrates 6 is cooled at the 5° C. as the second temperature.

Then, as the third process, the semiconductor substrates 6 having the second temperature (5° C.) are soaked in the etching liquid in the container 2. The etching process is performed for five (5) seconds under the condition that the etching liquid is agitated by $N_2$ bobbles in the rate of 10 L/min.

Finally, as the fourth process, the semiconductor substrates 6 are soaked into and are swung in the ultrapure water stored in the container 3 for thirty (30) seconds for removing the etching liquid adhering to the semiconductor substrates 6.

Preferably, semiconductor substrates 6 is further cleaned by the second ultrapure water having a room temperature such as 23° C., which is the fifth temperature stored in the container 10 for five (5) minutes as shown in FIG. 2.

Evaluation of the Result of Actual Experiment

Variation in characteristics is evaluated. Under the evaluation, the etching depths or etching shapes for ten semiconductor substrates 6 can be measured and evaluated by a stylus profilometers or atomic force microscope. Further, the evaluation can be judged by measuring the threshold voltage (Vth) of the transistor that the etching depths or etching shapes are sensitively reflected.

Compared with semiconductor substrates, which are soaked in the etching liquid having 5° C. for 5 seconds after the first process is performed, and then are soaked in the ultrapure water having the room temperature (23° C.) for 5 minutes in order to remove the etching liquid, the semiconductor substrates processed above has small variation in characteristics.

While the invention has been described with reference to illustrative embodiments, this description is not intended to be construed in a limiting sense. Thus, shapes, size and physical relationship of each component are roughly illustrated so the scope of the invention should not be construed to be limited to them. Further, to clarify the components of the invention, hatching is partially omitted in the cross-sectional views. Moreover, the numerical description in the embodiment described above is one of the preferred examples in the preferred embodiment so that the scope of the invention should not be construed to limit to them. For example, the semiconductor manufacturing apparatus in the first and the second embodiment, the cooling system is included because the etching process is performed by the low-temperature wet etching. However, the heating system can be introduced instead of the cooling system when the etching process is performed by the high-temperature wet etching.

Various other modifications of the illustrated embodiment will be apparent to those skilled in the art on reference to this description. Therefore, the appended claims are intended to cover any such modifications or embodiments as fall within the true scope of the invention.

We claim:

1. A method of manufacturing a semiconductor device having a process for cleaning a semiconductor substrate after the semiconductor substrate is etched for patterning, comprising:
   preparing the semiconductor substrate having a first temperature;
   setting the semiconductor substrate at a second temperature;
   etching the semiconductor substrate having the second temperature by etching liquid having a third temperature; and
   cleaning the semiconductor substrate to which the etching liquid is adhered, by ultrapure water having a fourth temperature,
   wherein the second temperature is set between the first and the third temperatures;
   wherein the fourth temperature is set between the first and the third temperatures; and
   wherein the fourth temperature is the same as the second temperature.

2. A method of manufacturing a semiconductor device as claimed in claim 1, wherein the third temperature is lower than the first temperature.

3. A method of manufacturing a semiconductor device as claimed in claim 1, further including:
   rinsing the semiconductor substrate with ultrapure water having a fifth temperature after cleaning the semiconductor substrate by the ultrapure water having the fourth temperature.

4. A method of manufacturing a semiconductor device as claimed in claim 3, wherein the fifth temperature is higher than the fourth temperature.

5. A method of manufacturing a semiconductor device, comprising:
   preparing a semiconductor substrate whose temperature is set at a room temperature, which is a first temperature;
   soaking the semiconductor substrate in ultrapure water stored in a first container in order to set the semiconductor substrate at a second temperature;
   etching the semiconductor substrate by etching liquid having a third temperature stored in a second container; and
   taking the semiconductor substrate out from the second container, and removing the etching liquid adhering to the semiconductor substrate by soaking the semiconductor substrate in ultrapure water having a fourth temperature,
   wherein the second temperature is set at the range between the first and the third temperatures;
   wherein there is a difference of almost 10° C. between the second temperature and the third temperature; and
   wherein the fourth temperature is the same as the second temperature.

6. A method of manufacturing a semiconductor device as claimed in claim 5, wherein the removing the etching liquid adhering to the semiconductor substrate is performed by soaking the semiconductor substrate in the ultrapure water stored in a first container.

7. A method of manufacturing a semiconductor device as claimed in claim 5, wherein the ultrapure water having the fourth temperature is stored in a third container.

8. A method of manufacturing a semiconductor device as claimed in claim 5, further including:
   rinsing the semiconductor substrate with ultrapure water having a fifth temperature stored in the fourth container after cleaning the semiconductor substrate by the ultrapure water having the fourth temperature, wherein the fifth temperature is substantially the same as the room temperature.

* * * * *